United States Patent [19]

Hieber et al.

[11] 4,331,702

[45] May 25, 1982

[54] METHOD FOR REPRODUCIBLE MANUFACTURE OF METALLIC LAYERS

[75] Inventors: Konrad Hieber; Norbert Mayer, both of Munich, Fed. Rep. of Germany

[73] Assignee: Siemens Aktiengesellschaft, Berlin and Munich, Fed. Rep. of Germany

[21] Appl. No.: 231,885

[22] Filed: Feb. 5, 1981

[30] Foreign Application Priority Data

Feb. 5, 1980 [DE] Fed. Rep. of Germany ....... 3004149

[51] Int. Cl.$^3$ ....................... C23C 13/02; C23C 15/00
[52] U.S. Cl. ................................. 427/10; 204/192 C; 427/91
[58] Field of Search ................ 427/10, 91; 204/192 C

[56] References Cited

PUBLICATIONS

K. Fuchs et al, "The Conductivity of Thin Metallic Films According to the Electron Theory of Metals", Proc. Cambridge Phil. Soc. vol. 34, (1938), pp. 100–108.
E. H. Sondheimer, "The Mean Free Path of Electrons in Metals", Advances In Physics, vol. 1, No. 1 (1952) pp. 1–42.
Y. Namba, "Resistivity and Temperature Coefficient of Thin Metal Films with Rough Surfaces", Japanese Journal of Applied Physics, vol. 9, No. 11 (1970), pp. 1326–1329.

Primary Examiner—James R. Hoffman
Attorney, Agent, or Firm—Hill, Van Santen, Steadman, Chiara & Simpson

[57] ABSTRACT

Reproducible manufacture of metallic layers for semiconductor and thin film technology is attained by dynamic control of the layering process whereby the specific electrical resistance, $\rho$, is determined as a function of layer thickness, d, and layering parameters are regulated by a process-control computer. With this process, factors effecting the growth of a layer with respect to its structure, texture and composition are identified and calculated as measured values of $\rho$ and d, by the process-control computer and corrections for individual layering parameters are calculated via a suitable control program. In this manner, the nucleation of a layer and its growth is influenced in such a manner that the layer exhibits the desired electrical, structural and texture properties in its final state.

6 Claims, 14 Drawing Figures

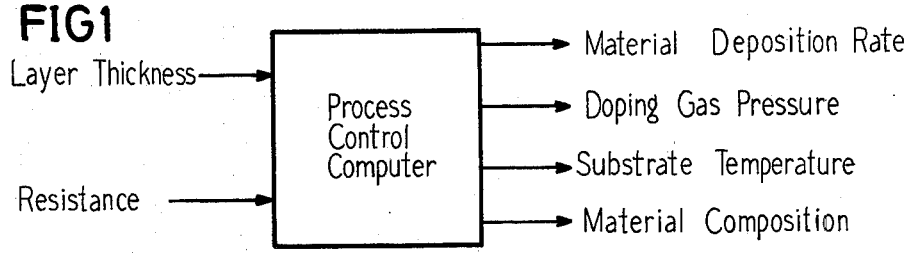
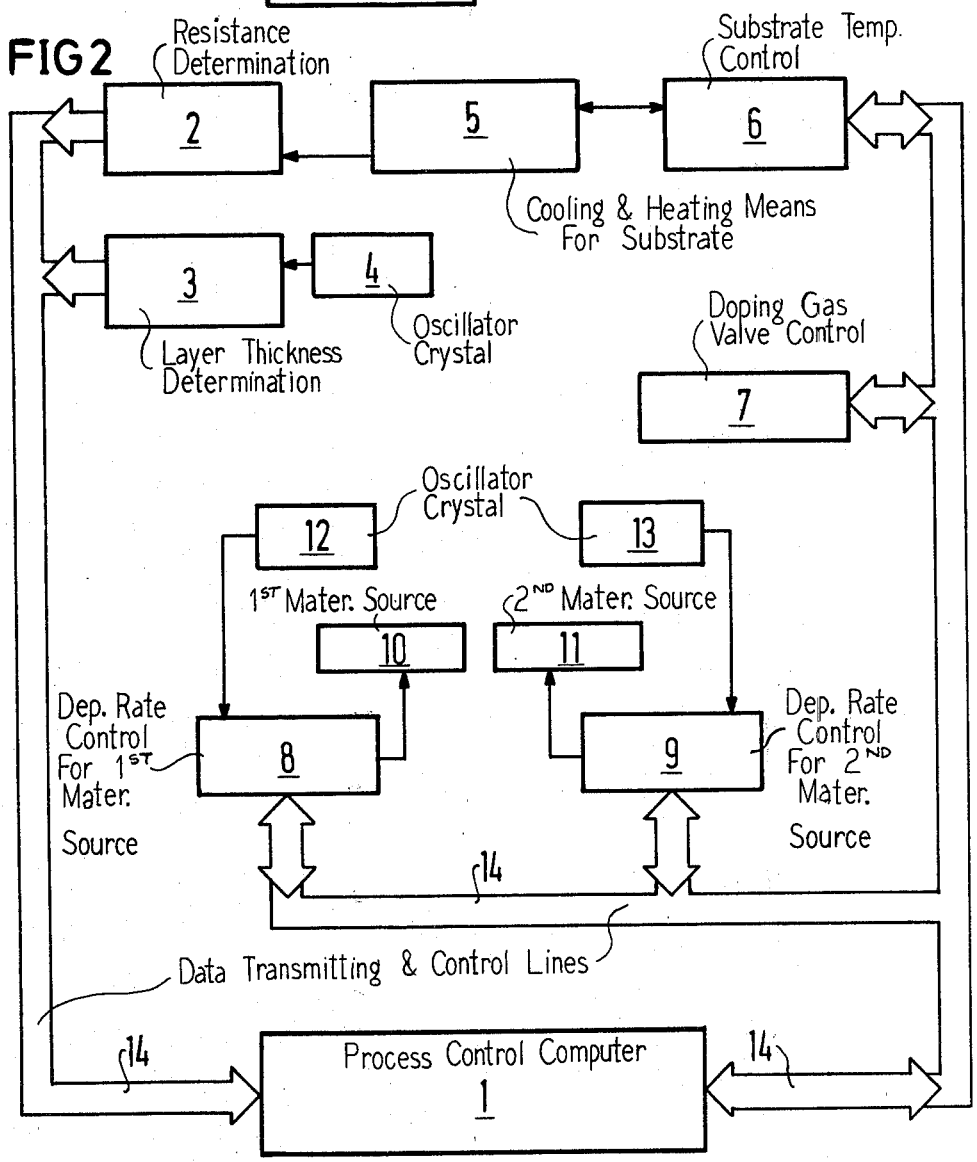

Program Overview For Process Computer

Program For Measured Value Determination Of Resistance & Thickness

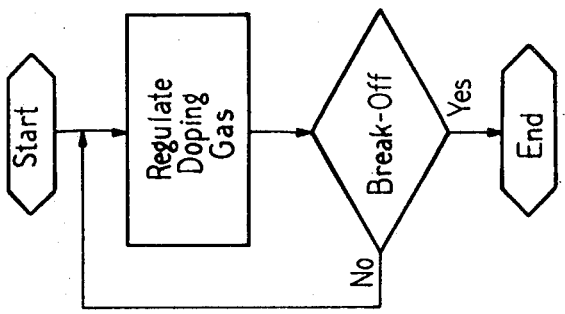
FIG. 11 Regulation Program 4 Doping Gas
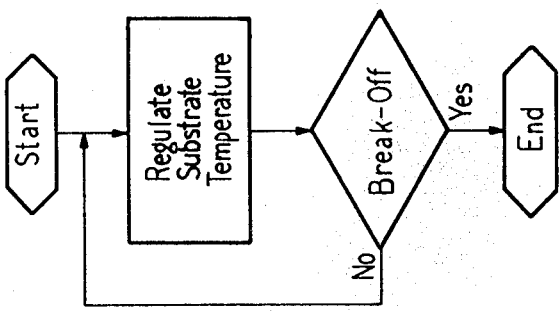
FIG. 10 Regulation Program 3 Temperature
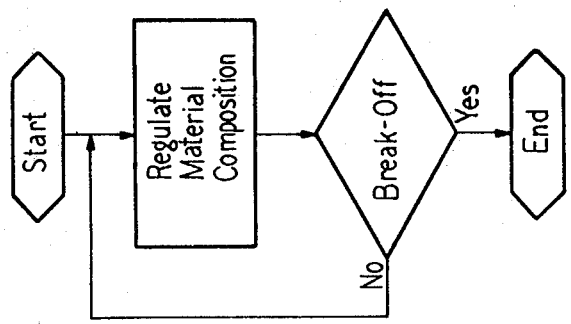
FIG. 9 Regulation Program 2 Material Composition
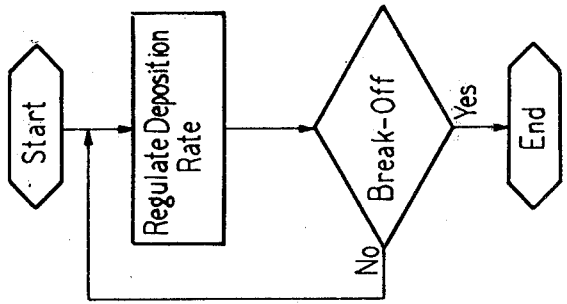
FIG. 8 Regulation Program 1 Dep. Rate

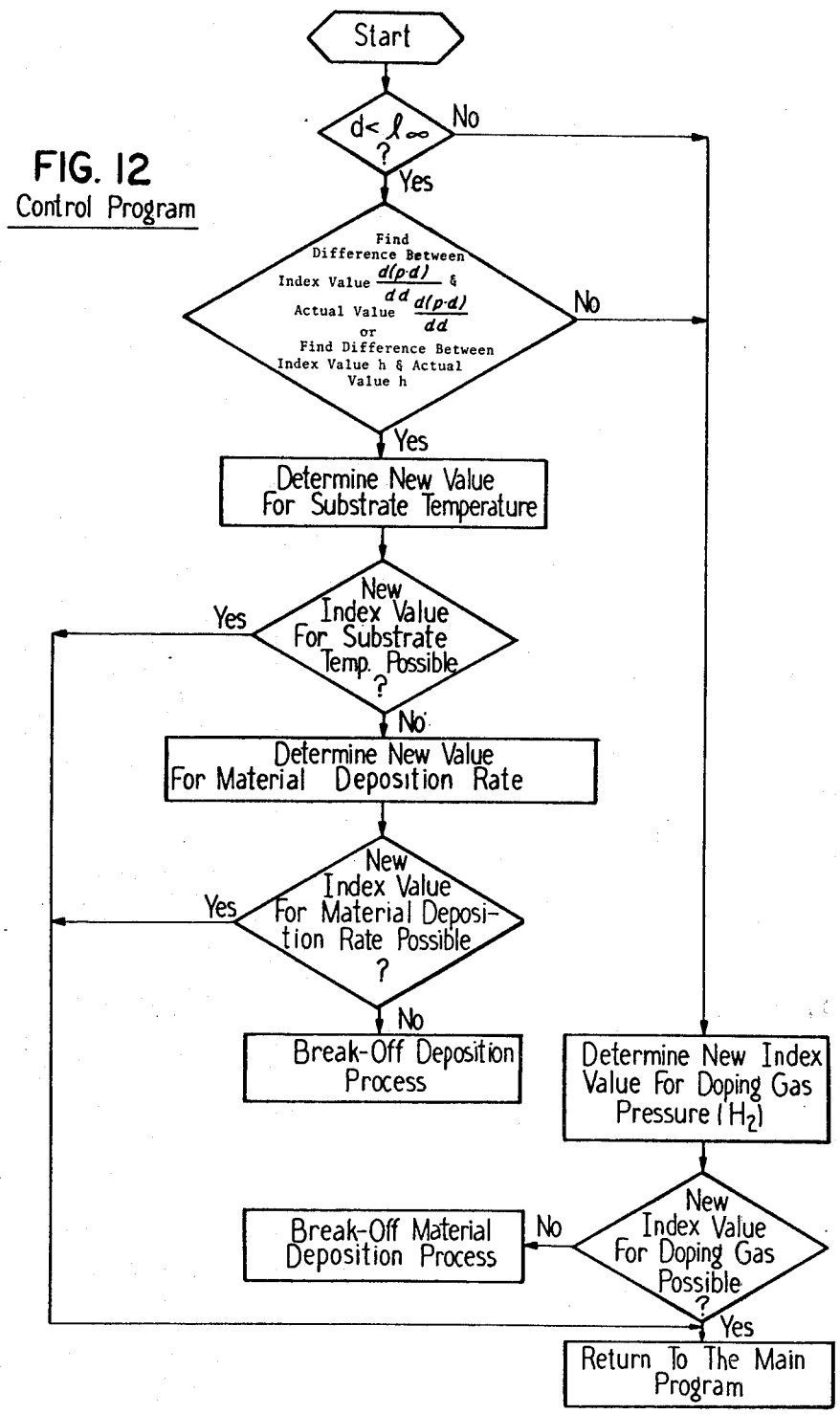

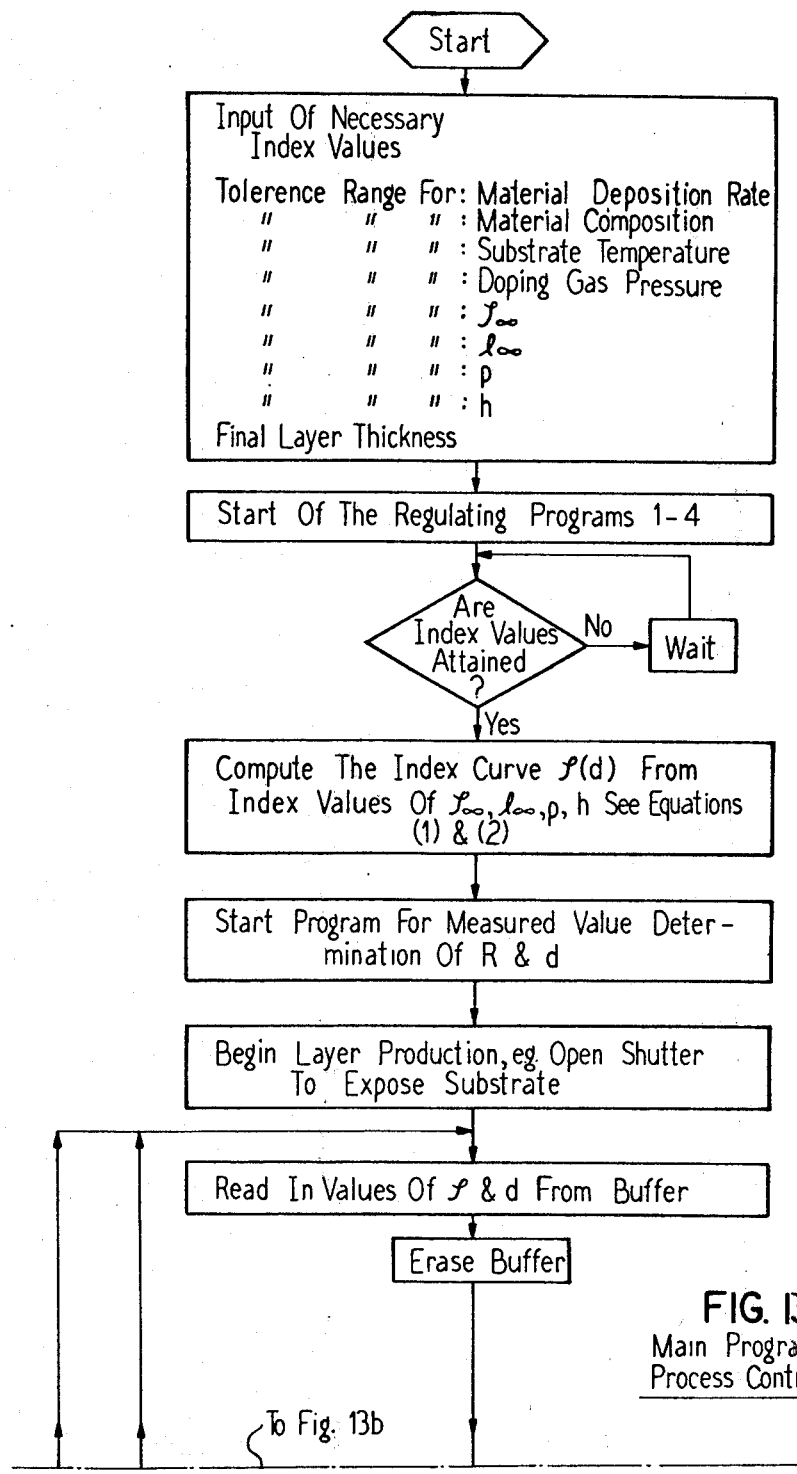

METHOD FOR REPRODUCIBLE MANUFACTURE OF METALLIC LAYERS

BACKGROUND OF THE INVENTION

1. Field of the Invention

The invention relates to a method of manufacturing metallic layers and somewhat more particularly to a method of reproducibly manufacturing metallic layers for semiconductor and thin film technology.

2. Prior Art

Extremely high requirements are made for tolerance and constancy in electrical properties of metallic layers utilized in semiconductor and thin film technologies. The temperature coefficient of electrical resistance of, for example, a thin film resistor composed, for example, of chromium-nickel, aluminum-tantalum or tantalum-oxynitride ($TaO_xN_y$) can only amount of a few $10^{-6}K^{-1}$. Further, the resistance value of such layers, which often are only 10 nm thick, can only change by a few percentage points over many years.

A further example of the high property requirements of metallic layers utilized in semiconductor and thin film technology is in the manufacture of $\beta$-tantalum layers which are required for certain thin film capacitors. This structural modification of $\alpha$-tantalum only occurs in thin layers when very specific nucleus formation and growth conditions are provided. In order to be able to controllably manufacture such layers, neither the composition nor the structure nor the texture of the layer can vary.

Such extremely high property requirements make it necessary to follow and, if necessary, control layer growth, practically beginning with a first mono-atomic layer.

SUMMARY OF THE INVENTION

The invention provides a method of reproducibly manufacturing metallic layers by dynamic means of controlling the growth or coating process whereby the specific electrical resistance is determined as a function of layer thickness and growth parameters are adjusted in accordance therewith.

The inventive method utilizes dynamic information concerning both the nucleation of a layer as well as the crystallization process during the layer growth to achieve reproducible metallic layers. Further, the inventive process allows accurate predictions concerning the expected electrical properties of a layer, already after a few mono-layers because the nucleus formation and the later growth can then still be influenced during further layer manufacture in such a manner that the finished layer exhibits desired electrical properties in its final state.

Heretofore, the following layer growth parameters were considered to be particularly important for reproducible manufacture of thin metal layers: substrate cleaning, final vacuum, residual gas composition, doping gas pressure, substrate temperature, deposited layer composition, deposition rate and layer thickness.

In the prior art, in order to obtain layers having specific properties, many experiments had to be first performed in order to discover the optimum combination of the above parameters. During manufacture of desired layers, it was necessary to carefully insure that these experimental parameters were observed as precisely as possible. After the manufacture of a layer, its relevant properties can only then be checked and only then can it be decided whether the so-grown layer exhibits the required properties. In the known methods, spoilage rates ranging from 1 through 50% occur, depending on the tolerance range. Accordingly, under certain conditions, high costs are encountered because the substrates, before they are coated with a metal layer, have often already passed through many process steps.

In accordance with the principles of the invention, controlled manufacture of metallic conductive layers is achieved whereby the factors which are effective for the growth of a layer with respect to its structure, its texture and its composition are identified and controlled by a process-control computer, with continuous measurements of the specific electrical resistance, $\rho$, as a function of layer thickness, $d$, in accordance with the following expression:

$$<\rho(d)> = \frac{d}{s} \int_0^s \frac{\rho[d(x)]}{d(x)} dx \qquad (1)$$

with $d(x) = d + h \sin 2\pi s \times$ (single dimensional Fourier development with one component) and $$\rho[d(x)] = \rho_\infty \left\{ 1 - \frac{3 l_\infty}{2 d(x)} (1-p) \int_1^\infty \left(\frac{1}{t^3} - \frac{1}{t^5}\right) \frac{1 - e^{\frac{-d(x)}{l_\infty} t}}{1 - p e^{\frac{-d(x)}{l_\infty} t}} dt \right\} \qquad (2)$$

wherein $\rho_\infty$ is the specific electrical resistance of an "infinite" thick layer with an internal structure identical to the layer with thickness d; $l_\infty$ is the mean free path length of an "infinite" thick layer with an internal structure identical to the layer with thickness d; p is a reflection parameter equal to the proportion of electrons reflected without resistance loss at the surface of said layer; h is the mean roughness amplitude of the surface of said layer; t is an integration variable and s is the wavelength of the periodic thickness fluctuations of the layer; with the actual values for $\rho_\infty$, $l_\infty$, p and h being continuously calculated as a function of measured actual values for $\rho$ and d and compared with rated values of $\rho_\infty$, d, $l_\infty$, p and h. The values determined are continuously utilized in setting the layer growth parameters, such as substrate temperature, deposition rate, doping gas pressure and layer composition for a dynamic control of the growth process until the measured actual values coincide with the calculated rated values.

In developing the invention, the following considerations were utilized:

Specific electrical resistance is a physical magnitude which, among other things, reacts with extreme sensitivity to lattice imperfections, contaminants and structural changes. Because electrical resistance and layer thickness are magnitudes which can be relatively easily determined, the specific electrical resistance, which can be calculated therefrom, is an ideal parameter to clearly define a metallic layer. The invention utilizes the theories of K. Fuchs, and H. H. Wills from "Proc. Cambridge Phil. Soc., Vol. 34 (1938) pages 101–108; of the theories of E. H. Sondtheimer from "Advances in Physics", Vol. 1 (1952), pages 1–41 and the theories of Y.

Namba from "Jap. Journ. of Applied Physics", Vol. 9, (1970), pages 1326–1329. From such theories, it can be deduced that, under ideal conditions, a layer thickness dependency on the specific electrical resistance can be exactly described.

The invention utilizes the principle that deviations of specific electrical resistance from an ideal path, which occur in real instances, can be attributed to structure and texture changes during manufacture. Such deviations effect a change of one or more of the actual values for $\rho\infty$, $l\infty$, p and h.

The processing of these theories occurs in such a manner than, even after deposition of very few monolayers, data concerning the nucleation of the layer exist and, simultaneously, the specific electrical resistance of a significantly thicker layer ($\rho\infty$) can be calculated in advance from the growth conditions prevailing at the moment.

Further, with the practice of the invention, values are derived for the mean free path length $l\infty$, the reflection parameter, p, and the surface roughness amplitude h, which, particularly with very thin layers, supplies the main component for increasing resistance in comparison to an "infinitely" thick layer. If the calculated values for $\rho\infty$, $l\infty$, p and h deviate from their respective rated values, then suitable parameters (for example, substrate temperature, deposition rate, doping gas pressure, etc) can be changed via the process-control computer even during the layer manufacture until the rated and actual values coincide. In this manner, the process control computer provides immediate information concerning how a change of a particular parameter will influence the final state of the layer. Thus, a dynamic control of nucleation as well as of layer growth is attained. This means that, in contrast to the present state of the art, a dynamic control of a material deposition process can be attained whereby a final check of layer properties becomes unnecessary.

BRIEF DESCRIPTION OF THE DRAWINGS

FIG. 1 is a diagrammatic illustration of the functional interrelationship of layer thickness and resistance to deposition parameters;

FIG. 2 is a block diagram of a computer-controlled deposition system utilized in the practice of the invention;

FIGS. 6–13 are diagrammatic flow charts of the inventive process.

DESCRIPTION OF PREFERRED EMBODIMENTS

As can be deduced from FIG. 1, present layer thickness and corresponding electrical resistance of a layer being grown must be continuously measured for process control during such layer manufacture. To achieve this, electrical leads are attached to a reference substrate before the layer manufacture begins in such a manner that a resistance measurement by a multi-point measurement, such as a 2- or 4-point measurement, can occur, given a defined specimen geometry. The resistance measurement occurs with the aid of a measuring system which measures continuously over as great a resistance range as possible (preferably $10^{10}$ through $10^{-6}$ ohm). Layer thickness of a specimen is measured during the growth process via a calibrated oscillator crystal system or via an optical interferometer system. A requirement for the resistance and layer thickness measuring means is that the measured values can be digitally transmitted to a process-control computer via a suitable interface immediately after measurement. An analog/digital converter, for example, is suitable as such an interface.

Proceeding from a plurality of measurements obtained one after another with the greatest possible speed, a dependency of the measured specific electrical resistance from the layer thickness is derived. Via a program built-up with the assistance of the relations (1) and (2) set forth earlier, the process-control computer then calculates corrections for individual growth parameters, which can be derived from the diagram illustrated at FIG. 1.

The block diagram illustrated at FIG. 2 is, essentially, self-explanatory. In an exemplary embodiment, the first material source 10 can be copper and the second material source 11 can be aluminum. Of course, other metallic materials may also be utilized. The data transmitting and control lines 14 can, for example, comprise standard IEEE 488-1975.

Exemplary embodiments for a process control in accordance with the principles of the invention are as follows:

1. Monitoring and controlling nucleation and layer growth up to $d < 10 \cdot l\infty$.

(a) The parameters $\rho$ and d are continuously measured and from this dependency the four parameters $\rho\infty$ $l\infty$ $1^p$ and h are continuously calculated via a suitable computer program. Depending on the deviations noted, a change of one or more manufacturing parameters occurs.

(b) Another means is attaining a thickness measurement at the beginning of ohmic conductivity in a layer being grown. Beginning with this thickness, the layer is continuous. The earlier a layer becomes continuous, all the greater is the nucleation density and all the smaller are the crystallites therein.

Figure 3:
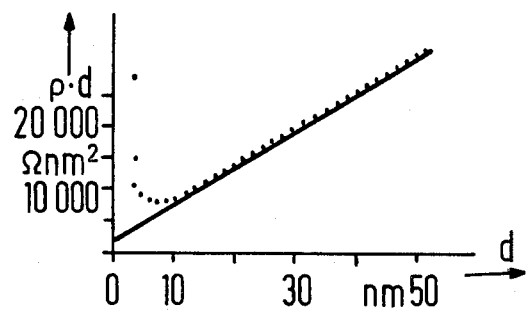
FIGS. 3–5 are graphical illustrations of resistance and thickness relation in exemplary metallic layers being produced in accordance with the principles of the invention.

At the same time, such layers have a relatively low surface roughness. As can be seen from FIG. 3, a good measurement for the beginning of ohmic conductivity is a minimum in layer thickness dependency of the value $\rho \cdot d$, which can be calculated by the process-control computer. The illustrated inclination corresponds to $\rho\infty$. The measured values (illustrated with dotted lines) in FIG. 3 relate to an aluminum/copper layer having 46.4 mol % copper, produced at $-160°$ C., substrate temperature. The calculated values for this exemplary embodiment are: $\rho\infty = 87.5$ $\mu\Omega$ cm, $l\infty = 0.8$ nm, p = 0.6 and h = 1.8 nm.

By a targeted control of a minimum, whereby, for example, a substrate temperature or deposition rate is changed, layers with specific surface roughness or grain size can readily be produced.

2. Monitoring and controlling the growth of layers having thicknesses $d > 10 \cdot l\infty$.

In this range of layer thicknesses, the dependency of a measured specific electrical resistance from a layer thickness can be fairly defined by an approximation of the Fuchs equation described by Sondtheimer, which is in the form of:

ti $d \cdot \rho(d) = \rho\infty \cdot d + \frac{3}{8}\rho\infty \cdot l\infty(1-p)$ (3)

All measured values should then lie on a straight line with the inclination $\rho\infty$, whereas the ordinate values are given by the magnitude $\frac{3}{8}\rho\infty l\infty(1-p)$.

Figure 4:
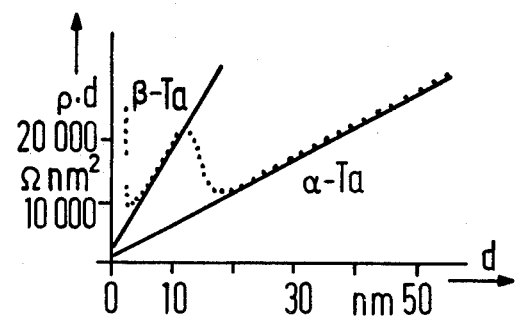

If a bend or deviation in the straight line occurs during layer growth, then this can be attributed to structural changes, for example, to the crystallization of an amorphous material or, as can be seen from FIG. 4, to the conversion of β-into α-tantalum during the manufacture of a pure tantalum layer at 300° C. Again, the dotted line shows the path of the measured values.

Figure 5:
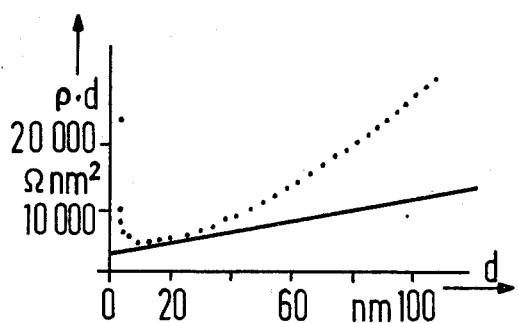

If, however, a continuous change of the inclination occurs from the measured values toward greater p·d values, as can be seen from FIG. 5, which depicts vapor deposition of a pure aluminum layer, then two causes for such change are present:

1. The roughness of the layer is increasing as a result of too great a grain growth; or
2. Cracks are occurring in the layer.

These results show how sensitively the specific electrical resistance reacts to specific changes in a layer so that it is possible by means of varying the correct parameter, to again set the growth conditions which supply the desired $\rho\infty$ value.

Figure 6:
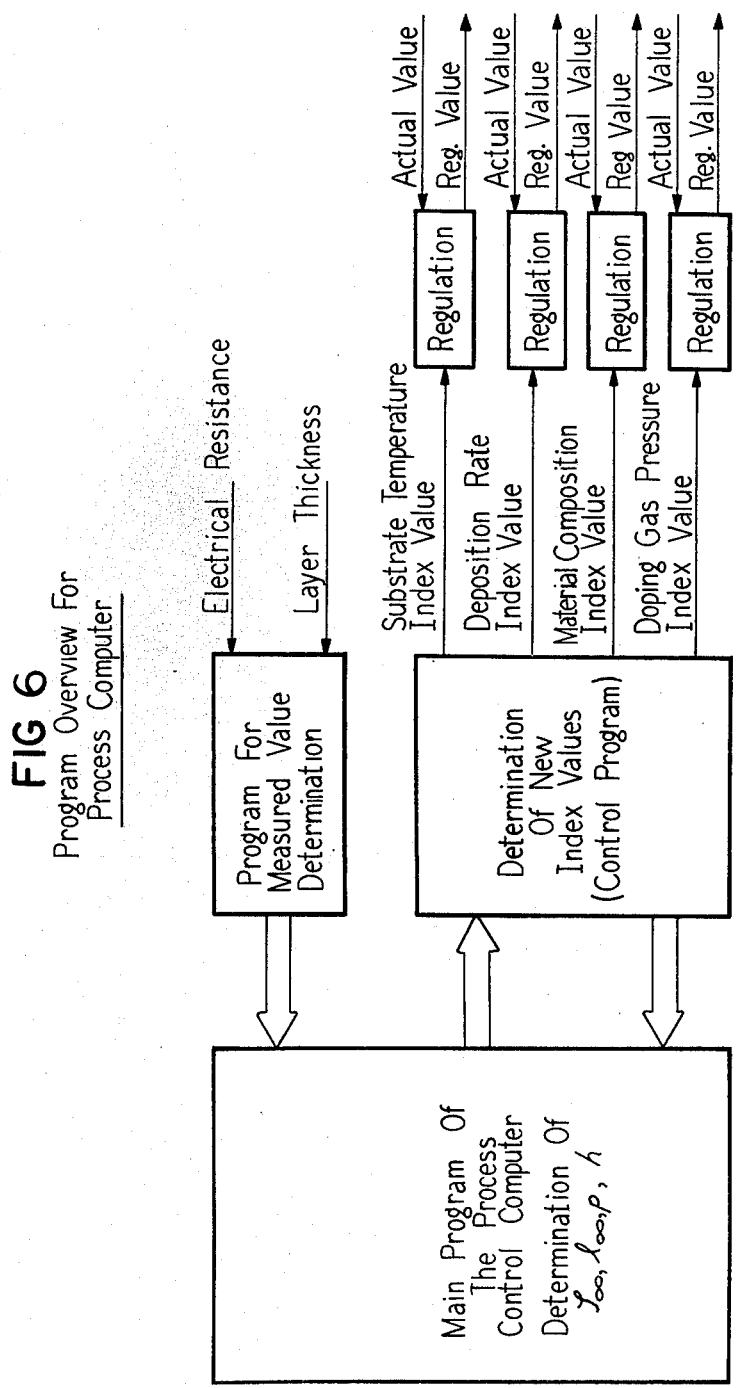

In FIG. 6, the basic process is illustrated in which the electrical resistance, the layer thickness, the substrate temperature, the deposition rate, the material composition and the doping gas pressure are input values from which index values are obtaining regulation values for substrate temperature, deposition rate, material composition and doping gas pressure are derived.

Figure 7:
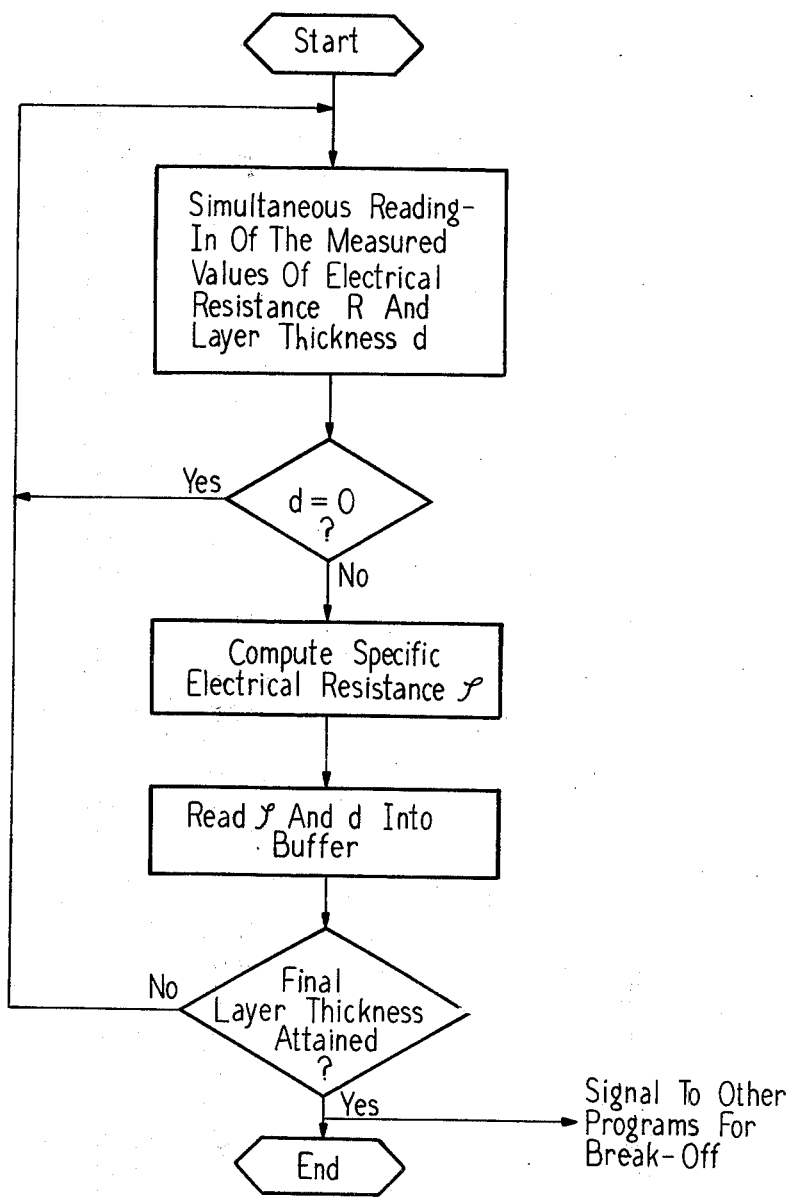

FIG. 7 illustrates a typical program for determining the measured values of resistance and thickness in which the measured value R of resistance can be obtained from an Ohmmeter (digital or analog with analog/digital conversion) and the measured value d can be obtained from an oscillating crystal system or an optical interferometer (digital or analog with analog/digital conversion). As is apparent, the measured values are continuously read until the thickness exceeds zero and then the specific resistance is computed and stored along with the thickness. Upon attaining the final layer thickness, this program is terminated and a break-off signal is transmitted to other operational programs.

FIGS. 8-11 illustrate the regulation programs, (Programs 1-4) for the deposition rate, the layer material composition, the substrate temperature and the doping gas pressure. These programs are substantially identical and terminate with break-off in response to proper and accurate regulation.

Referring to FIG. 8 and Program 1, the actual values are obtained from an oscillating crystal system or an optical interferometer and the index value is obtained from the main program. The regulating value controls the emission current of, for example, an electron gun or heating current with thermal vaporizers in the case of vacuum vapor deposition or, in the case of sputtering, controls the target power and/or the duration of the substrates under the individual targets.

Referring to FIG. 9 and Program 2, the actual values of the two oscillating crystal systems or optical interferometers are employed along with index values from the main program. Here, the regulating values, in the case of vaporizers, control the ratio of the rates of the two vaporizers, while with sputtering, the voltage ratio is controlled between, for example, two targets.

Referring to FIG. 10 and Program 3, the actual value is obtained, for example, from thermal elements or a resistance thermometer and where T is greater than 20° C., heating current is applied and where T is less than 20° C., a cooler is activated.

Referring to FIG. 11 and Program 4, the actual values are obtained, for example, from a pressure measuring tube or a mass spectrometer and the index value, of course, is obtained from the main program. Here, the regulating value is employed to control a dosage valve in a doping gas inlet.

It should be noted that the regulating program preferably operate independently of the other programs and the measured value determination program (FIG. 7) also preferably operates independently of other programs.

FIG. 12 illustrates a control program for newly determining the index value for the regulating programs, Programs 1-4, depending upon the material and target setting, for example, for sputtering or vaporization. In FIG. 12, aluminum is the exemplary material utilized and the control is designed to provide smooth layers. The thickness, d, is compared with $l\infty$ and the index values and the actual values of $d(\rho\cdot d)/dd$ are compared, or the index values and the actual values of h are compared. If there is no difference, a determination is made as to whether a new index value for the doping gas pressure is achievable. If a new index value is possible, a return is made to the main program. If not, the vacuum vapor-deposition process, for example, is terminated. If there is a difference in the index values of h or $d(\rho\cdot d)/dd$, a determination is made with respect to finding a new index value for substrate temperature. If such is possible, there is a return to the main program. If not, a determination is made with respect to a new index value for the material deposition rate. If a new index value is not possible, the deposition rate is broken-off. If a new index value can be determined, there is a return to the main program.

The same program operation holds true for tantalum for manufacture of layers without fissures, however, without a control for the doping gas pressure.

The same control is also utilized for amorphous alloy layers, for example, $Al_{60}$—$Cu_{40}$, in which, when $\rho\infty$ is not correct, a new index value is determined for the substrate temperature. When a new index value is not possible, a new index value is determined for the material deposition rate.

For control of crystalline alloy layers, with the same program, for example, Au—Ag, W—Cu, when $\rho\infty$ is not correct, a new index value is determined for the alloy composition. When p is not correct, a new index value is determined for the substrate temperature. When h is not correct, a new index value is determined for the substrate temperature, if possible, and where not possible, a new index value is determined for the material deposition rate.

For controlling resistance layers, the same program operation can be employed, for example:

(a) in producing a Cr-Si-O layer, when $\rho\infty$ or $l\infty$ is not correct, a new index value is determined for the doping gas pressure ($O_2$); or (b) in producing a single material layer, for example, W or Ta, when $\rho\infty$ or $l\infty$ is not correct, a new index value is determined for the doping gas pressure (Ar or $N_2$) when possible, and when not possible, a new index value is determined for the substrate temperature.

Figure 13B:
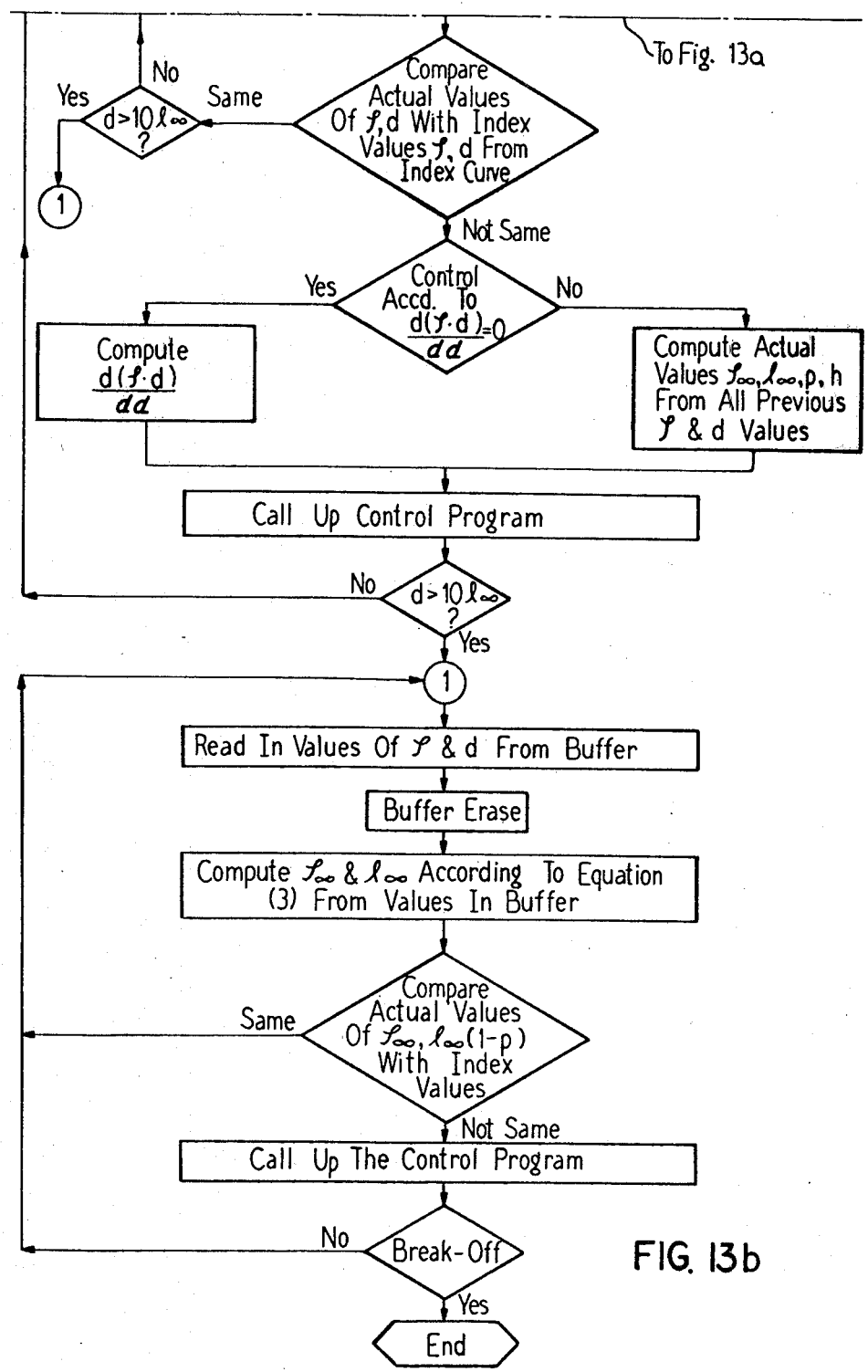

FIGS. 13a and 13b illustrate the main program of the process control computer. As is apparent, the index values are input for material deposition rate, material composition, substrate temperature, doping gas pressure, $\rho\infty$, $l\infty$, p and h and the desired final layer thickness. Then, the regulating programs of FIGS. 8-11 are run until such time as all index values are attained. Then the index curve ρ(d) is determined from the index values of $\rho\infty$, $l\infty$, p and h. Then, the program is started for measured value determination, that is the program of FIG. 7 and layer production is initiated. The stored values of ρ and d obtained from storage are then compared with the actual values. If these are the same and d is smaller than 10·l∞ the program goes back to read in the values of ρ and d from buffer (FIG. 13a). If these are the same and d is greater than 10·l∞ the program goes forward to read the values of ρ and d from buffer (FIG. 13b). If the actual values and the index values of ρ and d are not the same and no control according to d(ρ·d)/dd=0 is demanded the program computes the actual values of ρ∞, l∞, p and h from all previous ρ and d values. If the control according to d(ρ·d)/dd=0 is demanded the program computes d(ρ·d)/dd. In both cases actual values (as well d(ρ·d)/dd as ρ∞, l∞, p, h) are available for the control program of FIG. 12 which is called up now. As long as d is smaller than 10·l∞ the program goes back to read in the values of ρ and d from buffer (FIG. 13a). If d is greater 10·l∞, the values of ρ and d are read from storage and the buffer is erased and ρ∞ and l∞ are determined and compared with the index values. This routine is repeated until a comparison indicates that the values are not the same, at which time the control program (FIG. 12) is called up to determine the changes of the deposition parameters. The break-off of this program is initiated by a break-off of the programs of FIGS. 7, 12 or the program goes back to read in the values of ρ·d from buffer (FIG. 13b). As is apparent, the initial part of the main program concerns monitoring and control of the seeding or nucleation and layer growth to a thickness of less than 10·l∞, while the portion after calling up the program control is concerned with monitoring and controlling the growth of a layer having a thickness greater than 10·l∞.

The principles of the invention for controlling nucleation and lower growth is utilizible both for vapor deposition as well as for sputtering processes, both of which are well known.

As is apparent from the foregoing specification, the present invention is susceptible of being embodied with various alterations and modifications which may differ particularly from those that have been described in the proceding specification and description. For this reason, it is to be fully understood that all of the foregoing is intended to be merely illustrative and is not to be construed or interpreted as being restrictive or otherwise limiting of the present invention, excepting as it is set forth and defined in the hereto-appended claims.

We claim as our invention:

1. A method for reproducible manufacture of metallic layers for semiconductor and thin film technology with the aid of an operable material deposition system including an enclosed vacuum chamber, a substrate positioned in said chamber, heat-exchange means for controlling the temperature of said substrate, at least one metallic material source positioned in said chamber facing said substrate, energy means for supplying energy to said material source, a doping gas source connected via a controllable valve with said chamber, measuring means for determining thickness of a layer deposited on said substrate, measuring means for determining resistance of a layer deposited on said substrate and control means interconnected with and selectively controlling said heat-exchange means, said energy means and said doping gas source relative to a signal derived from said measuring means, comprising the steps of:

(a) continuously depositing and building a metallic layer on said substrate;

(b) cyclically and independently measuring the thickness, d, and the electrical resistance of said metallic layer and generating signals corresponding to such measured values;

(c) forming index values for, ρ∞, l∞, p, h and cyclically determining the specific electrical resistance, ρ, as a function of layer thickness, d, in accordance with the expression:

$$<\rho(d)> = \frac{d}{s} \int_0^s \frac{\rho[d(x)]}{d(x)} dx \quad (1)$$

with d(x)=d+h sin 2π/s × and $$\rho[d(x)] = \rho_\infty \left\{ 1 - \frac{3l_\infty}{2d(x)}(1-p) \int_1^\infty \left(\frac{1}{t^3} - \frac{1}{t^5}\right) \frac{1 - e^{-\frac{d(x)}{l_\infty}t}}{1 - pe^{-\frac{d(x)}{l_\infty}t}} dt \right\} \quad (2)$$

wherein ρ∞ is the specific electrical resistance of an "infinite" thick layer with an internal structure identical to the said metallic layer; l∞ is the mean free path length of an "infinite" thick layer with an internal structure identical to the said metallic layer; p is a reflection parameter equal to the proportion of electrons reflected without resistance loss at the surface of said layer; h is the mean roughness amplitude of the surface of said layer; t is an integration variable and s is the wavelength of periodic thickness fluctuations of said layer;

(d) cyclically determining the actual values of ρ∞, l∞, p and h relative to said measured values and comparing the same to said respective index values so as to derive respective control parameters; and (e) selectively applying said control parameters to said control means for regulating material deposition rate, substrate temperature, layer composition and doping gas pressure.

2. A method as defined in claim 1 wherein said measured value for layer thickness and resistance are input directly or by an analog/digital converter into said control means.

3. A method as defined in claim 1 wherein measurement of specific electrical resistance is undertaken with the aid of a reference substrate by a multi-point measurement, said measuring means having a resistance range from $10^{10}$ through $10^{-6}$ ohm.

4. A method as defined in claim 1 wherein layer thickness measurement is undertaken with the aid of a calibrated oscillator crystal system.

5. A method as defined in claim 1 wherein layer thickness measurement is undertaken with the aid of an optical interferometer.

6. A method as defined in claim 1 wherein step (a) occurs via a vapor-deposition or a sputtering process.

* * * * *